(12) United States Patent
Tsai et al.

(10) Patent No.: US 10,867,831 B1
(45) Date of Patent: Dec. 15, 2020

(54) METHOD AND APPARATUS FOR BONDING SEMICONDUCTOR DEVICES (71) Applicant: Taiwan Semiconductor Manufacturing Co., Ltd., Hsinchu (TW)

(72) Inventors: Yan-Zuo Tsai, Hsinchu (TW); Yang-Chih Hsueh, Hsinchu (TW); Chia-Yin Chen, Hsinchu (TW); Fu-Kang Tien, Hsinchu (TW); Ebin Liao, Hsinchu (TW); Wen-Chih Chiou, Zhunan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/993,595

(22) Filed: Aug. 14, 2020

Related U.S. Application Data

(63) Continuation of application No. 16/390,248, filed on Apr. 22, 2019, now Pat. No. 10,748,803, which is a continuation of application No. 15/925,206, filed on Mar. 19, 2018, now Pat. No. 10,269,611.

(60) Provisional application No. 62/592,916, filed on Nov. 30, 2017.

(51) Int. Cl.
*H01L 21/67* (2006.01)
*H01L 21/66* (2006.01)
*H01L 21/683* (2006.01)
*H01L 23/00* (2006.01)

(52) U.S. Cl.
CPC .... *H01L 21/6835* (2013.01); *H01L 21/67057* (2013.01); *H01L 21/67144* (2013.01); *H01L 21/6836* (2013.01); *H01L 22/12* (2013.01); *H01L 24/75* (2013.01); *H01L 24/83* (2013.01); *H01L 2221/68327* (2013.01); *H01L 2221/68381* (2013.01)

(58) Field of Classification Search
CPC ..... H01L 21/6835; H01L 24/83; H01L 22/12; H01L 24/75
See application file for complete search history.

(56) References Cited

U.S. PATENT DOCUMENTS

| | | | |
|---|---|---|---|
| 10,269,611 B1 | 4/2019 | Tsai et al. | |
| 2005/0045914 A1* | 3/2005 | Agranat | H01L 21/67144 257/200 |
| 2014/0185914 A1 | 7/2014 | Lee et al. | |

FOREIGN PATENT DOCUMENTS

| | | |
|---|---|---|
| TW | 200511543 A | 3/2005 |
| TW | 201425917 A | 7/2014 |
| TW | 201501225 A | 1/2015 |

* cited by examiner

*Primary Examiner* — Kyoung Lee
(74) *Attorney, Agent, or Firm* — Slater Matsil, LLP (57) ABSTRACT

A method and apparatus for bonding semiconductor devices are disclosed. In an embodiment, the method may include attaching a first die to a flip head of a flip module, flipping the first die with the flip module, removing the first die from the flip module after flipping the first die, inspecting the flip head of the flip module for contamination after removing the first die, cleaning the flip head with an in situ cleaning module after inspecting the flip head, and attaching a second die to the flip head after cleaning the flip head.

20 Claims, 8 Drawing Sheets

METHOD AND APPARATUS FOR BONDING SEMICONDUCTOR DEVICES

CROSS-REFERENCE TO RELATED APPLICATIONS

This application is a continuation of U.S. patent application Ser. No. 16/390,248, filed on Apr. 22, 2019 and entitled "Method and Apparatus for Bonding Semiconductor Devices," which is a continuation of U.S. patent application Ser. No. 15/925,206, filed on Mar. 19, 2018 (now U.S. Pat. No. 10,269,611, issued Apr. 23, 2019) and entitled "Method and Apparatus for Bonding Semiconductor Devices," which claims the benefit of U.S. Provisional Application No. 62/592,916, filed on Nov. 30, 2017 and entitled "Method and Apparatus for Bonding Semiconductor Devices," which patent applications are incorporated herein by reference.

BACKGROUND

A common requirement for semiconductor processing and advanced packaging of integrated circuit is assembly of integrated circuit dies to a substrate to form a completed device. The integrated circuit dies typically include active and passive circuit devices, such as transistors and capacitors, fabricated in a semiconductor process. A plurality of connector terminals are formed on the active surface of the integrated circuit dies. The assembly of the dies to the substrates requires that the integrated circuit dies be separated from a semiconductor wafer; each of the integrated circuit dies is then mounted with the respective connector terminals forming electrical and physical connections to corresponding pads or lands on a substrate.

In one process, "flip chip" bonding is performed. Individual integrated circuit dies are fabricated on a semiconductor wafer in a semiconductor process. The dies are then separated from the semiconductor wafer by a wafer dicing or "singulation" process. The integrated circuit dies are then removed from a wafer mount tape or other support by a "pick and place" tool. The substrate has lands or pads configured to align with the connector terminals of the integrated circuit die. The integrated circuit die and the substrate are aligned and then brought together in physical contact. A solder reflow process is used to electrically and physically couple the connector terminals of the integrated circuit to the pads/lands on the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
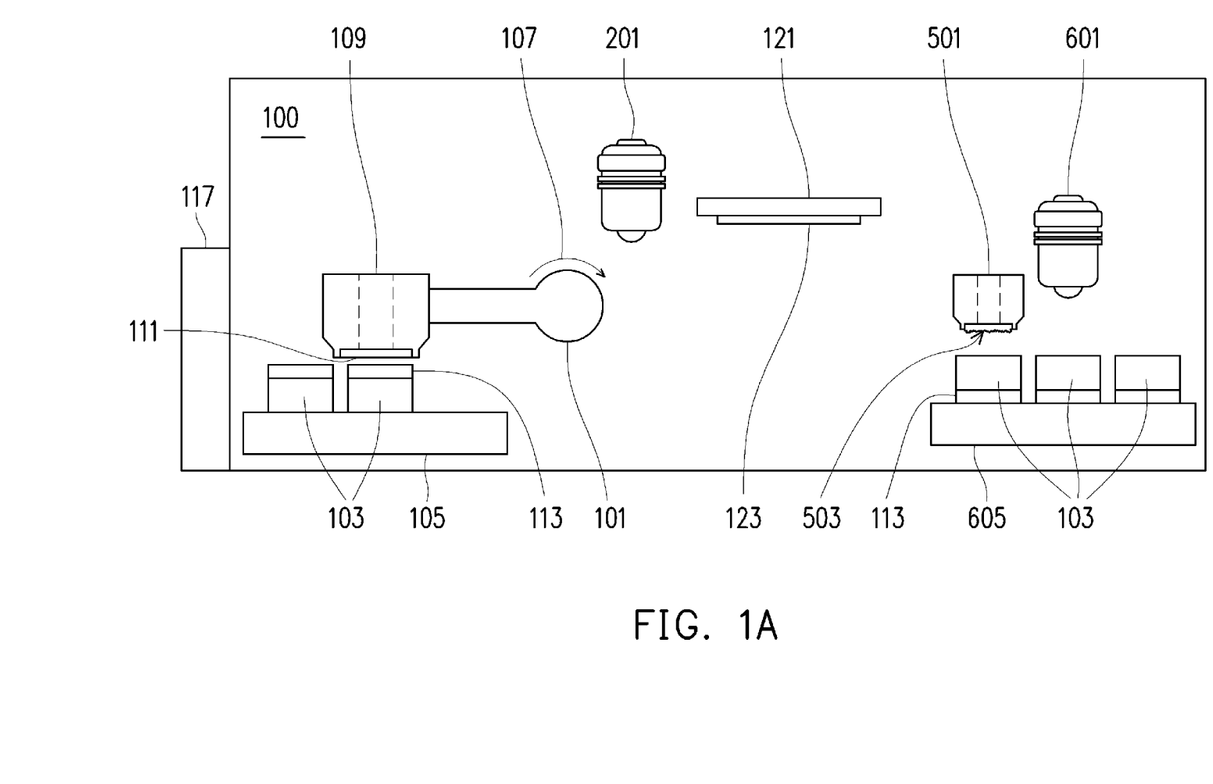
FIG. 1A illustrates a cross-sectional view of a bonding apparatus in accordance with some embodiments.

FIG. 1A illustrates a cross-sectional view of a bonding apparatus 100. The bonding apparatus 100 includes a load lock chamber 117, a flip module 101, an inspection module 201, a cleaning module 121, a bond tool 501, and an overlay inspection module 601. The bonding apparatus 100 is used for a pick-and-place process in which semiconductor dies 103 mounted on a die support 105 are removed from the die support 105, flipped, placed on a semiconductor wafer 605, and bonded to the semiconductor wafer 605. Accordingly, the bonding apparatus 100 may be used to form a system on integrated chip (SoIC).

However, while the bonding apparatus 100 may be used in various illustrative embodiments to form an SoIC, the present application is not intended to be limited to the formation of an SoIC. The bonding apparatus 100 may be used to form any other package or semiconductor device, such as, for example, a system on chip (SOC), a three-dimensional integrated circuit (3D-IC), or the like. All such packages and devices are fully intended to be included within the scope of the embodiments.

The load lock chamber 117 is a chamber of the bonding apparatus 100 in which work pieces, such as the die support 105 and the semiconductor wafer 605, can be loaded into the bonding apparatus 100 for processing and unloaded from the bonding apparatus 100 after processing is complete. For example, as illustrated in FIG. 1A, the die support 105 and the semiconductor wafer 605 can be loaded into or unloaded from the bonding apparatus 100 through the load lock chamber 117. In addition to other functions, the load lock chamber 117 functions as a vacuum/atmosphere switch chamber, allowing work pieces to be loaded into and removed from the bonding apparatus 100 without breaking the atmospheric conditions (e.g., vacuum) within the various processing chambers of the bonding apparatus 100. From the load lock chamber 117, the wafers can be transferred to various chambers (not separately illustrated) and/or modules of the bonding apparatus 100.

To begin the bonding process within the bonding apparatus 100, the die support 105 is loaded into the bonding apparatus 100 through the load lock chamber 117. The die support 105 has a plurality of semiconductor dies 103 mounted on the top surface thereof. Each of the semiconductor dies 103 includes a plurality of connector terminals 113 (represented in FIG. 1A by the box labeled 113), which are used to connect electrical circuits of the semiconductor dies 103 to electrical circuits present in the semiconductor wafer 605. As illustrated in FIG. 1A, when the semiconductor dies 103 are mounted on the die support 105, the connector terminals 113 are disposed on upper surfaces of the semiconductor dies 103 opposite the surfaces of the semiconductor dies 103 which are mounted to the die support 105.

Figure 1B:
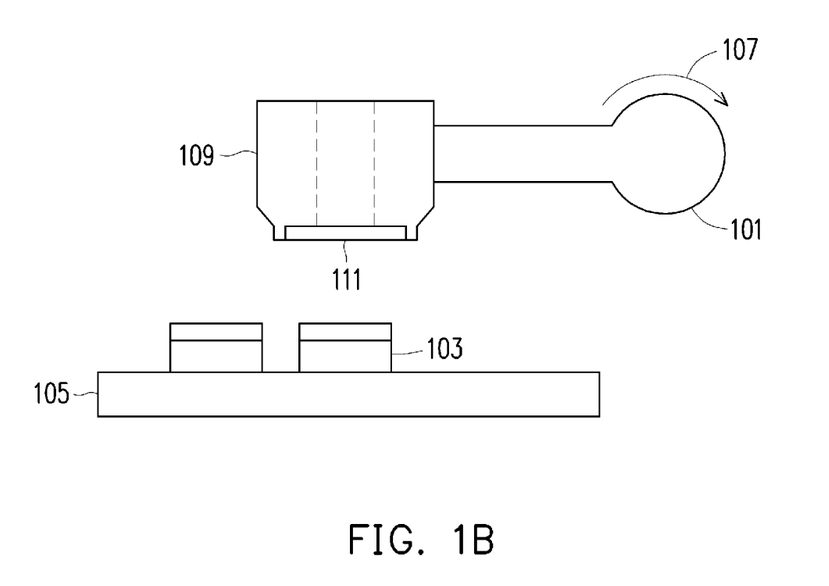
FIG. 1B illustrates a cross-sectional view of a flip module and a wafer including a plurality of dies in accordance with some embodiments.

FIG. 1B illustrates a magnified cross-sectional view of the flip module 101 and the semiconductor dies 103 mounted on the die support 105. The die support 105 may comprise a wafer-mount tape to which the semiconductor dies 103 are adhesively mounted and a frame which supports the wafer-mount tape and the semiconductor dies 103. According to various embodiments, the wafer-mount tape may comprise an ultra-violet (UV) wafer-mount tape or another tape, the adhesive strength of which can be weakened such that the semiconductor dies 103 can easily be removed from the die support 105.

The individual semiconductor dies 103 may comprise semiconductor layers such as a substrate, active circuit layers, ILD layers, and IMD layers (not separately illustrated). For example, the semiconductor dies 103 may comprise a substrate (not separately illustrated), such as a silicon substrate, a silicon-on-insulator substrate, or the like. The semiconductor dies 103 may further comprise a variety of electrical circuits (not separately illustrated), such as n-type metal-oxide semiconductor (NMOS) and/or p-type metal-oxide semiconductor (PMOS) devices including transistors, capacitors, resistors, diodes, photo-diodes, fuses and the like. The electrical circuits may be interconnected to perform one or more functions. The functions may include memory, processing, sensing, amplifying, power distribution, input/output or the like. However, the above examples are provided for illustrative purposes only to further explain applications of the present disclosure and are not meant to limit the embodiments in any manner.

The flip module 101 sequentially flips and transfers the semiconductor dies 103 from the die support 105 to the bond tool 501 (see FIG. 1A). More specifically, the flip module 101 includes a flip head 109 having a flip surface 111. The flip module 101 may include an attachment mechanism such as a vacuum tool (represented in FIG. 1B by dashed vacuum holes extending through the flip head 109) which attaches one of the semiconductor dies 103 to the flip surface 111 of the flip head 109. In a particular embodiment, one of the semiconductor dies 103 is attached to the flip module 101 by bringing the flip surface 111 of the flip head 109 into contact with the semiconductor die 103 and applying a vacuum to the semiconductor die 103 through the vacuum tool of the flip module 101. However, any suitable method of attaching the semiconductor dies 103 to the flip surface 111 of the flip module 101 may be utilized.

The flip surface 111 of the flip head 109 may be formed of a material such as silicon rubber, polymer materials, organic materials, or the like, and may be shaped to accommodate one of the semiconductor dies 103 to be flipped. For example, the flip surface 111 may have a circular shape, a rectangular shape, a square shape, or the like. The flip surface 111 may have a width or diameter of between about 0.1 mm and about 10 mm, such as about 5 mm. However, any suitable shapes or dimensions may be utilized.

Once the semiconductor die 103 is attached to the flip surface 111, the flip module 101 positions the semiconductor die 103 for transfer to the bond tool 501. In one embodiment, the flip module 101 may rotate, as indicated by arrow 107, to flip the semiconductor die 103. After each of the semiconductor dies 103 is flipped or otherwise positioned, the connector terminals 113 are facing an opposite direction to their original position. This ensures that the connector terminals 113 are facing toward the semiconductor wafer 605 when the semiconductor dies 103 are placed on the semiconductor wafer 605 by the bond tool 501.

Returning now to FIG. 1A, once the semiconductor die 103 has been flipped, the semiconductor die 103 is then transferred to a bond tool surface 503 of the bond tool 501. The bond tool 501 may include an attachment mechanism such as a vacuum tool (represented in FIG. 1A by dashed vacuum holes extending through the bond tool 501) which may be used to attach the semiconductor dies 103 to the bond tool surface 503 of the bond tool 501. In a particular embodiment, the semiconductor die 103 is attached to the bond tool 501 by bringing the bond tool surface 503 into contact with the semiconductor die 103 (on a side opposite the connector terminals 113) and applying a vacuum to the semiconductor die 103 through the vacuum tool of the bond tool 501. Once the semiconductor die 103 is attached to the bond tool surface 503, the semiconductor die 103 is released from the flip surface 111 of the flip module 101 by, e.g., releasing the vacuum applied by the flip module 101.

However, if contamination is present on the flip surface 111 of the flip module 101 and the contamination is not removed, the contamination can be transferred from the flip surface 111 to the semiconductor dies 103 or the contamination can cause misalignment during the transfer process from the flip module 101 to the bond tool 501. In either case, the contamination may result in poor alignment or poor bonding between the semiconductor dies 103 and the semiconductor wafer 605, causing bonding yield drop. The flip surface 111 may be contaminated by various methods, such as particles falling on the flip surface 111, residue being left on the flip surface 111 by a non-optimized cleaning of the semiconductor dies 103, through contact with dirty surfaces, and the like.

Accordingly, once the semiconductor die 103 is released from the flip surface 111 of the flip module 101, the flip surface 111 may move to the inspection module 201 for an inspection in order to determine whether contamination is present on the flip surface 111. As illustrated in FIG. 1A, in an embodiment, the inspection module 201 may be disposed in the bonding apparatus 100. This may allow for the inspection module 201 to perform an inspection process on the flip surface 111 of the flip module 101 in situ.

Figure 2:
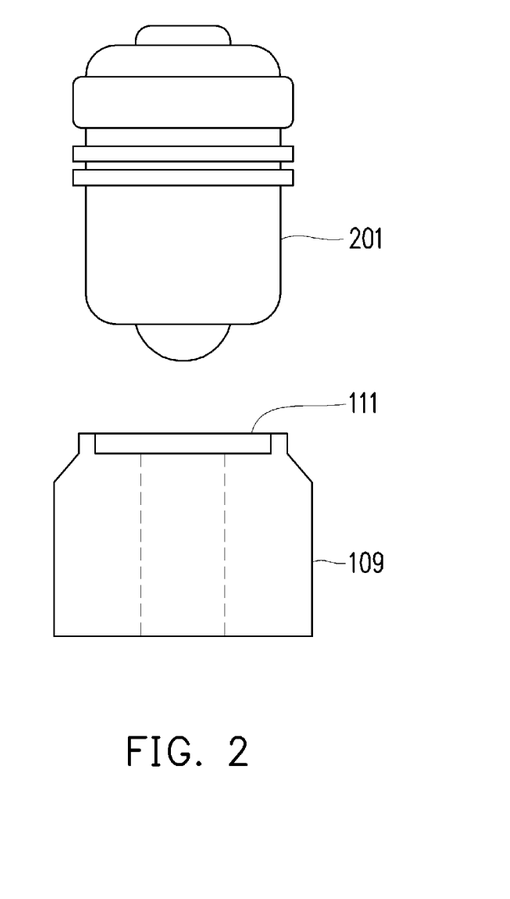
FIG. 2 illustrates a cross-sectional view of an inspection module and a flip head in accordance with some embodiments.

FIG. 2 illustrates a magnified cross-sectional view of the flip head 109 and the inspection module 201 during an inspection process. The inspection module 201 may comprise an optical microscope, an infrared microscope, a scanning electron microscope (SEM), a scanning probe microscope (SPM), an ultra-violet (UV) detector, or the like. The inspection module 201 detects contamination present on the flip surface 111 of the flip module 101 by capturing a surface image of the flip surface 111 and comparing the captured surface image to a clean reference image. The captured surface image and the clean reference image may be visual images, infrared images, or the like. The inspection module 201 may compare the two images in order to determine the percentage of the flip surface 111 which is contaminated.

In an embodiment in which the inspection module 201 comprises an optical microscope or an infrared microscope, the inspection module 201 may further comprise a camera (not separately illustrated). The camera may be used to capture a surface image of the flip surface 111. In other embodiments in which the inspection module 201 comprises an SEM or an SPM, the SEM or the SPM may scan the flip surface 111 in a raster scan pattern and produce a surface image based on this scan.

In an embodiment, the clean reference image (for comparison purposes) may be captured by the inspection module 201. According to at least one embodiment, the inspection module 201 may produce the clean reference image by capturing a surface image of the flip surface 111 that is known to be clean, such as at a point in time prior to handing any of the semiconductor dies 103. According to other embodiments, the inspection module 201 may capture a surface image of a flip surface 111 and an operator may examine the surface image to ensure that the captured surface image is clean, thereby producing the clean reference image. The clean reference image may be captured by the inspection module 201 in the same manner as the captured surface images such that the captured surface images can be compared to the clean reference image. According to at least one embodiment, a different inspection module from the inspection module 201, such as an optical microscope, an infrared microscope, a scanning electron microscope (SEM), a scanning probe microscope (SPM), or the like, may be used to capture the clean reference image. Any suitable method for producing a clean reference image may be utilized.

The captured surface image and the clean reference image may be stored as raster images comprising a plurality of pixels. Once stored, the inspection module 201 may compare the captured surface image with the clean reference image by detecting any variations between the captured surface image and the clean reference image. For example, the inspection module 201 may compare each pixel of the captured surface image to a corresponding pixel of the clean reference image and determine the number of pixels in which a variation is found. The inspection module 201 may then calculate the percentage of the flip surface 111 that is contaminated by dividing the number of pixels containing a variation by the total number of pixels. However, any suitable method for detecting contamination present on the flip surface 111 may be used.

If the inspection module 201 determines that the percentage of the flip surface 111 which is contaminated is greater than a threshold value, the flip surface 111 is cleaned by the cleaning module 121. For example, the flip surface 111 may be cleaned by the cleaning module 121 if the percentage of the flip surface 111 which is contaminated is greater than a non-zero threshold of about 1%, about 5%, about 10%, or the like. However, any suitable threshold may be utilized.

In one embodiment, the inspection module 201 may inspect the flip surface 111 after each of the semiconductor dies 103 is flipped. In another embodiment, the inspection module 201 may inspect the flip surface 111 after a certain number of the semiconductor dies 103 are flipped. For example, the inspection module 201 may inspect the flip surface 111 each time between two and fifteen of the semiconductor dies 103 are flipped, such as each time five or ten of the semiconductor dies 103 are flipped. However, any suitable inspection frequency may be utilized. Moreover, the inspection module 201 may re-inspect the flip surface 111 after the flip surface 111 has been cleaned by the cleaning module 121 (described further below) in order to determine whether the flip surface 111 has been sufficiently cleaned. Any suitable pattern or process may be utilized for inspecting the flip surface 111.

Figure 3:
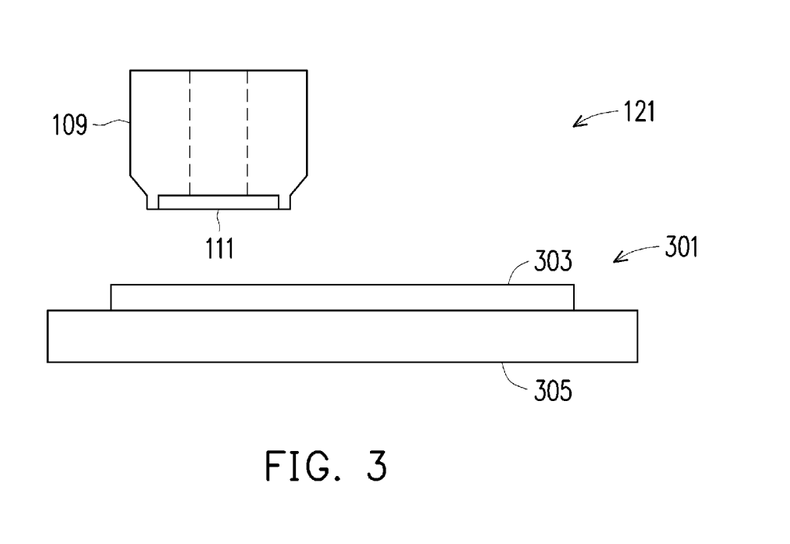
FIG. 3 illustrates a cross-sectional view of a flip head and an adhesive cleaning module in accordance with some embodiments.

Returning to FIG. 1A, once the inspection module 201 determines that the flip surface 111 should be cleaned, the flip surface 111 is moved by the flip module 101 to the cleaning module 121, which is also located in situ. In an embodiment, the cleaning module 121 may comprise an adhesive cleaning module and/or a liquid cleaning module. For example, FIG. 3 illustrates a magnified cross-sectional view of an embodiment in which the cleaning module 121 comprises an adhesive cleaning module 301. The adhesive cleaning module 301 comprises an adhesive material 303 and an adhesive material carrier 305 on which the adhesive material 303 is mounted. The adhesive material 303 may comprise an adhesive material such as a tape, or other sticky material. More specifically, the adhesive material 303 may comprise a resin, an adhesive tape, a pressure-sensitive tape (e.g., Scotch Tape), or the like. The adhesive material 303 may have a thickness of between about 1 µm and about 100 µm, such as about 10 µm.

According to several embodiments, the adhesive material 303 may be sized to clean the whole surface of the flip surface 111 or one or more portions of the flip surface 111. As such, while the specific dimensions of the adhesive material 303 are at least partially dependent upon the size of the flip surface 111 (which may be at least partially dependent upon the size of the semiconductor dies 103), in a particular embodiment, the adhesive material 303 may have a width of between about 1 mm and about 50 mm, such as about 10 mm. The adhesive material 303 may have a length of between about 1 mm and about 50 mm, such as about 10 mm. However, any suitable dimensions may be utilized.

The adhesive material carrier 305 may carry one or more of the adhesive materials 303. The adhesive material carrier 305 may be made of any material suitable for supporting the adhesive material 303. For example, in at least one embodiment, the adhesive material carrier 305 comprises a polymer, glass, ceramic, metal, or other suitable materials. The adhesive material carrier 305 may be the same size as or larger than the adhesive material 303. For example, in some embodiments, the adhesive material carrier 305 may have a width of between about 2 mm and about 52 mm, such as about 12 mm and a length of between about 2 mm and about 52 mm, such as about 12 mm. Any suitable adhesive material carrier 305 having any suitable dimensions may be utilized.

The flip surface 111 may be cleaned by the adhesive cleaning module 301 by contacting the flip surface 111 against a surface of the adhesive material 303 such that contaminants present on the flip surface 111 adhere to the surface of the adhesive material 303 and are thus removed from the flip surface 111. In one embodiment, the flip surface 111 may be contacted with the adhesive material 303 once to remove the contaminants from the flip surface 111. In another embodiment, the flip surface 111 may be contacted with the adhesive material 303 multiple times in order to sufficiently clean the flip surface 111. For example, the flip surface 111 may be contacted with the adhesive material 303 between one time and ten times, such as five times. Any suitable pattern or process may be utilized to clean the flip surface 111 with the adhesive cleaning module 301.

According to various embodiments, the flip surface 111 may be contacted against the adhesive material 303 with an applied pressure. For example, the flip surface 111 may be contacted against the adhesive material 303 with an applied pressure of between about 0.5 N and about 50 N, such as about 5 N. Moreover, the flip surface 111 may be contacted against the adhesive material 303 for a predetermined time. According to some embodiments, the predetermined time may be between about 0.1 seconds and about 10 seconds, such as about 3 seconds. Any suitable combinations of time and pressure may be utilized to clean the flip surface 111 with the adhesive cleaning module 301.

Figure 4:
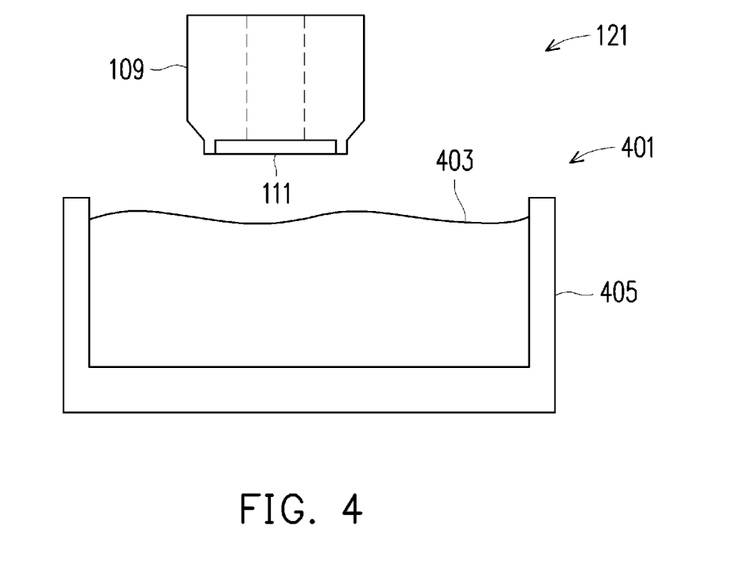
FIG. 4 illustrates a cross-sectional view of a flip head and an adhesive liquid module in accordance with some embodiments.

FIG. 4 illustrates a magnified cross-sectional view of another embodiment in which the cleaning module 121 comprises a liquid cleaning module 401. The liquid cleaning module 401 comprises a liquid cleaning solution 403 and a cleaning solution carrier 405, which contains the liquid cleaning solution 403. The liquid cleaning solution 403 may remove contaminants from the flip surface 111 by physical removal, physical dissolution, or chemical dissolution. For example, according to some embodiments, the liquid cleaning solution 403 may remove contaminants from the flip surface 111 by physical removal and the liquid cleaning solution may comprise water or the like. According to other embodiments, the liquid cleaning solution 403 may remove contaminants from the flip surface 111 by physical dissolution and the liquid cleaning solution 403 may comprise a solvent such as acetone, isopropyl alcohol (IPA), or the like. In still other embodiments, the liquid cleaning solution 403 may remove contaminants from the flip surface 111 by chemical dissolution and the liquid cleaning solution 403 may comprise a corrosive substance. However, any suitable liquid may be used as the liquid cleaning solution 403.

The cleaning solution carrier 405 may be configured to contain the liquid cleaning solution 403. The cleaning solution carrier 405 may be made of any material suitable for containing the liquid cleaning solution 403. For example, in at least one embodiment, the cleaning solution carrier 405 comprises a metal (e.g., stainless steel), ceramic, glass, or other suitable materials. In various embodiments, the cleaning solution carrier 405 may be made of a material that is inert to the liquid cleaning solution 403. However, any suitable cleaning solution carrier 405 may be utilized.

According to several embodiments, the cleaning solution carrier 405 may be sized such that the liquid cleaning solution 403 may clean the whole surface of the flip surface 111. As such, while the specific dimensions of the cleaning solution carrier 405 are at least partially dependent upon the size of the flip surface 111 (which may be at least partially dependent upon the size of the semiconductor dies 103), in a particular embodiment, the cleaning solution carrier 405 may have a width of between about 5 mm and about 50 mm, such as about 10 mm. The cleaning solution carrier 405 may have a length of between about 5 mm and about 50 mm, such as about 10 mm. The cleaning solution carrier 405 may have walls surrounding the liquid cleaning solution 403, the walls having a thickness of between about 0.5 mm and about 5 mm, such as about 1 mm. However, any suitable dimensions may be utilized.

The flip surface 111 may be cleaned by the liquid cleaning module 401 by submerging the flip surface 111 in the liquid cleaning solution 403 such that contaminants present on the flip surface 111 of the flip module 101 are removed from the flip surface 111 to the cleaning solution 403. In an embodiment in which the liquid cleaning solution 403 includes a solvent, the contaminants may be physically dissolved in the liquid cleaning solution 403. Moreover, in an embodiment in which the liquid cleaning solution 403 includes a corrosive substance, the contaminants may be chemically dissolved in the liquid cleaning solution 403.

In one embodiment, the flip surface 111 may be submerged in the liquid cleaning solution 403 once to remove the contaminants from the flip surface 111. In another embodiment, the flip surface 111 may be submerged in the liquid cleaning solution 403 multiple times in order to sufficiently clean the flip surface 111. For example, the flip surface 111 may be submerged in the liquid cleaning solution 403 between one time and ten times, such as five times. Any suitable pattern or process may be utilized to clean the flip surface 111 with the liquid cleaning solution 403.

The flip surface 111 may be submerged below the surface of the liquid cleaning solution 403 a predetermined depth. For example, the flip surface 111 may be submerged below the surface of the liquid cleaning solution 403 by a depth of between about 0.1 mm and about 5 mm, such as about 1 mm. Moreover, the flip surface 111 may be submerged in the liquid cleaning solution 403 for a predetermined time. According to some embodiments, the predetermined time may be between about 0.1 seconds and about 10 seconds, such as about 3 seconds. Any suitable combination of time and submerged depth may be utilized to clean the flip surface 111 with the liquid cleaning module 401.

Following the cleaning by the liquid cleaning module 401, the flip surface 111 may be dried. According to an embodiment, the flip surface 111 may be dried by applying a chemical drying agent, such as isopropyl alcohol (IPA), to the flip surface 111. According to various embodiments, the flip surface 111 may be dried by evaporation or any other process. The flip surface 111 may be dried more quickly by applying wind or heat to the flip surface 111. Any suitable process may be utilized to dry the flip surface 111.

According to various embodiments, the cleaning module 121 may comprise the adhesive cleaning module 301, the liquid cleaning module 401, both the adhesive cleaning module 301 and the liquid cleaning module 401, any combination thereof (e.g., multiple adhesive cleaning modules 301 and/or multiple liquid cleaning modules 401), or the like. According to some embodiments, the flip surface 111 may be cleaned by both the adhesive cleaning module 301 and the liquid cleaning module 401 each time the inspection module 201 determines that the percentage of the flip surface 111 that is contaminated is greater than the threshold value. According to other embodiments, the flip surface 111 of the flip module 101 may be cleaned by either of the adhesive cleaning module 301 or the liquid cleaning module 401 upon an initial determination by the inspection module 201 that the percentage of the flip surface 111 that is contaminated remains greater than the threshold value. The flip surface 111 may then be cleaned by the other of the adhesive cleaning module 301 or the liquid cleaning module 401 if the inspection module 201 determines that the percentage of the flip surface 111 that is contaminated is greater than the threshold value upon re-inspection of the flip surface 111. Any suitable pattern or process of the adhesive cleaning module 301 and the liquid cleaning module 401 may be utilized to clean the flip surface 111.

According to various embodiments, the inspection module 201 in combination with the cleaning module 121 (which may comprise the adhesive cleaning module 301 and/or the liquid cleaning module 401) may detect and clean any contaminants present on the flip surface 111 of the flip module 101. Thus, the inspection module 201 and the cleaning module 121 may ensure that contaminants are not transferred to the semiconductor dies 103 and any misalignment caused by contaminants on the flip surface 111 is avoided. This ensures that good bonds will be formed between the semiconductor dies 103 and the semiconductor wafer 605 and that bonding yield drop is prevented.

Returning to FIG. 1A, after the semiconductor die 103 has been transferred from the flip module 101 to the bond tool 501, the bond tool 501 aligns the semiconductor die 103 over a desired position on the semiconductor wafer 605 to which the semiconductor die 103 will be bonded. The bond tool 501 then moves the semiconductor die 103 downward onto the surface of the semiconductor wafer 605 such that the connector terminals 113 of the semiconductor die 103 contact connector terminals such as bond pads (not separately illustrated) formed on the surface of the semiconductor wafer 605.

The semiconductor wafer 605 may include a silicon substrate, or other suitable structures such as an interposer substrate. In some embodiments, the semiconductor wafer 605 may comprise a substrate formed of silicon, although it may also be formed of other group III, group IV, and/or group V elements, such as silicon, germanium, gallium, arsenic, and combinations thereof. The substrate may comprise a bulk substrate or a silicon-on-insulator (SOI) substrate.

The semiconductor wafer 605 may also include a plurality of semiconductor dies (not separately illustrated) formed on an upper surface of the substrate. According to at least one embodiment, the semiconductor dies of the semiconductor wafer 605 may be manufactured to work in conjunction with the semiconductor dies 103. The semiconductor dies of the semiconductor wafer 605 may include the connector terminals such as the plurality of bond pads formed on upper surfaces thereof.

Once the semiconductor die 103 has been aligned with and is in physical contact with the semiconductor wafer 605, heat and/or pressure may be applied to the semiconductor die 103 in order to bond the semiconductor die 103 to the semiconductor wafer 605. In an embodiment, the semiconductor die 103 may be bonded to the semiconductor wafer 605 through hybrid bonding. However, any suitable bonding may be used to bond the semiconductor die 103 to the semiconductor wafer 605, such as, for example, direct surface bonding (i.e., oxide-to-oxide bonding), metal-to-metal bonding, solder bonding, or the like.

In an embodiment in which hybrid bonding is utilized, the pressure may be applied to the semiconductor die 103 to bond the semiconductor die 103 to the semiconductor wafer 605. The semiconductor die 103 may also be heated to a prescribed temperature. The heat and/or pressure may be applied to the semiconductor die 103 for a predetermined time. However, any suitable temperature, pressure, and time may be utilized to bond the semiconductor die 103 to the semiconductor wafer 605.

According to an embodiment, each of the semiconductor dies 103 may be bonded sequentially to the semiconductor wafer 605. For example, pressure may be applied to each of the semiconductor dies 103 by the bond tool 501 after the semiconductor die is placed on the surface of the semiconductor wafer 605. Moreover, heat may be applied to each of the semiconductor dies 103 after the semiconductor die 103 is placed on the semiconductor wafer 605. Thus, the semiconductor dies 103 may be sequentially bonded to the surface of the semiconductor wafer 605.

According to another embodiment, a plurality of semiconductor dies 103 may be simultaneously bonded to the semiconductor wafer 605. For example, an initial placement of each of the semiconductor dies 103 may be performed, and then a pressure plate (not separately illustrated) may be utilized to apply pressure to each of the semiconductor dies 103 of the plurality of semiconductor dies 103 simultaneously. The pressure plate may also apply heat to the plurality of semiconductor dies 103. Accordingly, the plurality of semiconductor dies 103 may simultaneously be bonded to the surface of the semiconductor wafer 605. However, any suitable process may be used to bond the semiconductor dies 103 to the semiconductor wafer 605.

Figure 5A:
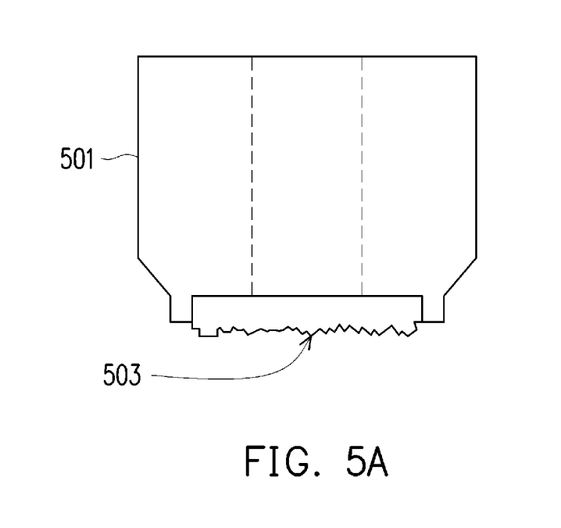
FIGS. 5A and 5B illustrate cross-sectional views of a bond tool head and a die in accordance with some embodiments.

FIG. 5A illustrates a magnified cross-sectional view of the bond tool 501. As illustrated in FIG. 5A, the bond tool 501 includes a bond tool surface 503. After each of the semiconductor dies 103 is flipped by the flip module 101, the semiconductor die 103 is transferred to the bond tool 501. As discussed previously, the bond tool 501 may include an attachment mechanism such as a vacuum tool, which may be used to attach the semiconductor die 103 to the bond tool surface 503 of the bond tool 501.

The bond tool surface 503 has a rough surface, such that a surface roughness, Ra, of the bond tool surface 503, is greater than about 0.5 µm. According to various other embodiments, the surface roughness of the bond tool surface 503 may be between about 0.5 µm and about 50 µm, such as about 1 µm. The bond tool surface 503 may be formed of a material such as metal, ceramic, polymer, or the like. The bond tool surface 503 may have a circular shape, a rectangular shape, a square shape, or the like. The bond tool surface 503 may have a width or diameter of between about 0.5 mm and about 50 mm, such as about 5 mm.

Figure 5B:
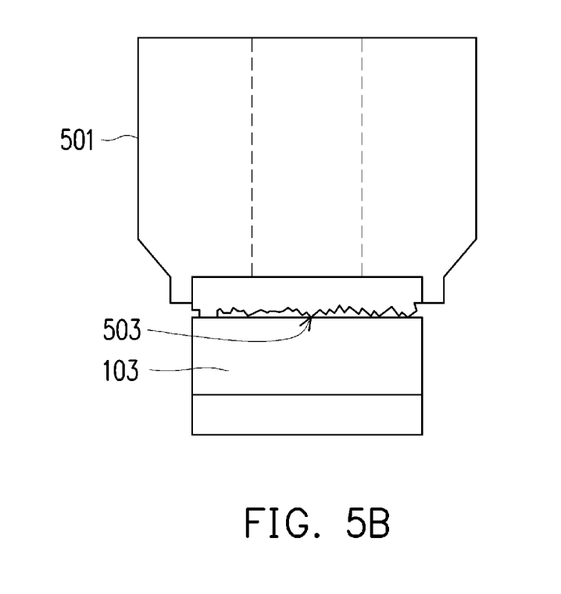

FIG. 5B illustrates a magnified cross-sectional view of the bond tool 501 and one of the semiconductor dies 103. As illustrated in FIG. 5B, the rough bond tool surface 503 prevents perfect contact between the bond tool surface 503 and the top surface of the semiconductor die 103. Perfect contact between the bond tool surface 503 and a semiconductor die 103 can induce a vacuum pressure between the bond tool surface 503 and the semiconductor die 103 outside of the vacuum holes of the vacuum tool of the bond tool 501. This induced vacuum pressure between the bond tool surface 503 and the semiconductor die 103 can cause interfacial bulging. This interfacial bulging can result in poor bonding between the semiconductor dies 103 and the semiconductor wafer 605 and can lead to bonding yield drop.

However, because the bond tool surface 503 has a rough surface, an induced vacuum pressure is reduced or prevented from being formed between the bond tool surface 503 and the semiconductor dies 103. Further, interfacial bulges are reduced or prevented from being formed in the semiconductor dies 103. Accordingly, better bonding can be achieved between the semiconductor dies 103 and the semiconductor wafer 605 and bonding yield drop due to interfacial bulges is reduced or prevented.

Figure 6A:
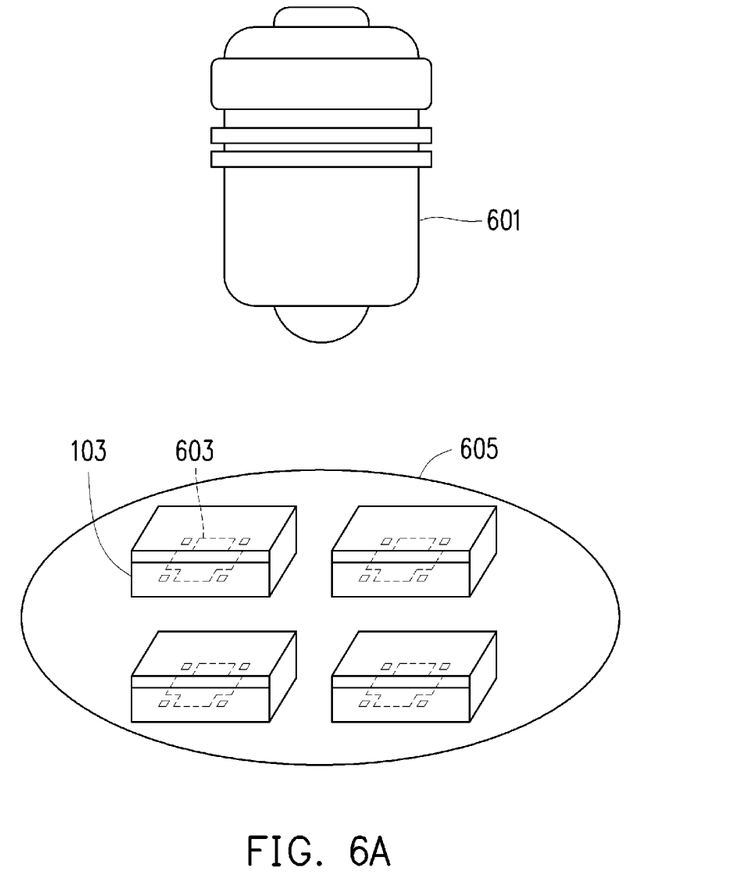
FIGS. 6A and 6B illustrate a perspective view and a top-down view of an overlay inspection module and a wafer including a plurality of dies in accordance with some embodiments.

Returning to FIG. 1A, after each semiconductor die 103 is bonded to the semiconductor wafer 605, the overlay inspection module 601 may inspect the relative position of the semiconductor die 103 and a pattern, such as an alignment mark, formed on the surface of the semiconductor wafer 605. FIG. 6A is a magnified perspective view of the overlay inspection module 601 and the semiconductor wafer 605. As illustrated in FIG. 6A, a plurality of semiconductor dies 103 are bonded to the surface of the semiconductor wafer 605. The surface of the semiconductor wafer 605 includes a plurality of patterns 603. The patterns 603 may be alignment marks and may be used by the overlay inspection module 601 in order to detect the alignment and position of each of the semiconductor dies 103 bonded to the semiconductor wafer 605. In various embodiments, the overlay inspection module 601 may comprise an infrared optical microscope, a visual optical microscope, or the like. The overlay inspection module 601 may detect the position of the patterns 603 formed on the surface of the semiconductor wafer 605 and/or the position of each of the semiconductor dies 103 in order to determine the relative alignment between the semiconductor wafer 605 and each of the semiconductor dies 103.

Figure 6B:
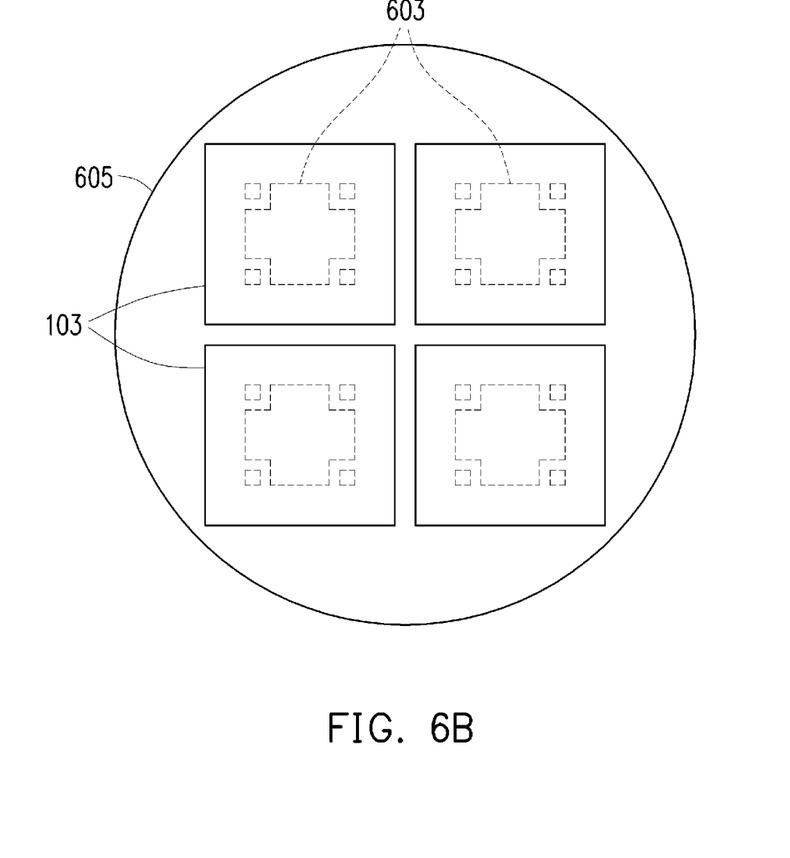

FIG. 6B is a magnified top-down view of the semiconductor wafer 605 having the patterns 603 (not drawn to scale) formed on the surface thereof and the semiconductor dies 103 bonded to the surface thereof. The overlay inspection module 601 may be used to ensure that each of the semiconductor dies 103 is placed in the correct position on the surface of the semiconductor wafer 605 relative to the patterns 603. After a semiconductor die 103 is mounted on the surface of the semiconductor wafer 605, the overlay inspection module 601 may inspect the relative positions of the semiconductor die 103 and the semiconductor wafer 605 to ensure proper alignment.

The overlay inspection module 601 may inspect and correct the relative positions of the semiconductor dies 103 and the semiconductor wafer 605 by first determining the actual position of a first semiconductor die 103 relative to the semiconductor wafer 605. The overlay inspection module 601 then compares the actual position to a desired position of the first semiconductor die 103 on the semiconductor wafer 605. The overlay inspection module 601 then calculates a shift, which is the difference between the actual position of the first semiconductor die 103 and the desired position of the first semiconductor die 103 on the surface of the semiconductor wafer 605.

Once the shift is determined, the overlay inspection module 601 sends a signal to the bond tool 501 (illustrated in FIGS. 5A and 5B) which indicates the shift of the first semiconductor die 103. The bond tool 501 corrects the position of a second semiconductor die 103 to be placed based on the shift of the first semiconductor die 103 determined by the overlay inspection module 601. However, any suitable method may be used to correct shift in the semiconductor die 103 placement on the semiconductor wafer 605.

The semiconductor dies 103 may be transparent to the rays emitted by the overlay inspection module 601 such that the patterns 603 formed on the semiconductor wafer 605 can be detected by the overlay inspection module 601 through the semiconductor dies 103. According to various embodiments, the overlay inspection module may check the position of the semiconductor dies 103 relative to the semiconductor wafer 605 after each semiconductor wafer 103 is bonded to the surface of the semiconductor wafer 605, or after a certain number of semiconductor dies 103, such as five, ten, or the like, are bonded to the semiconductor wafer 605. Accordingly, the overlay inspection module 601 may ensure proper placement and bonding of the semiconductor dies 103 on the surface of the semiconductor wafer 605. The overlay inspection module 601 may further ensure that any abnormal die placement is rectified immediately.

Figure 7:
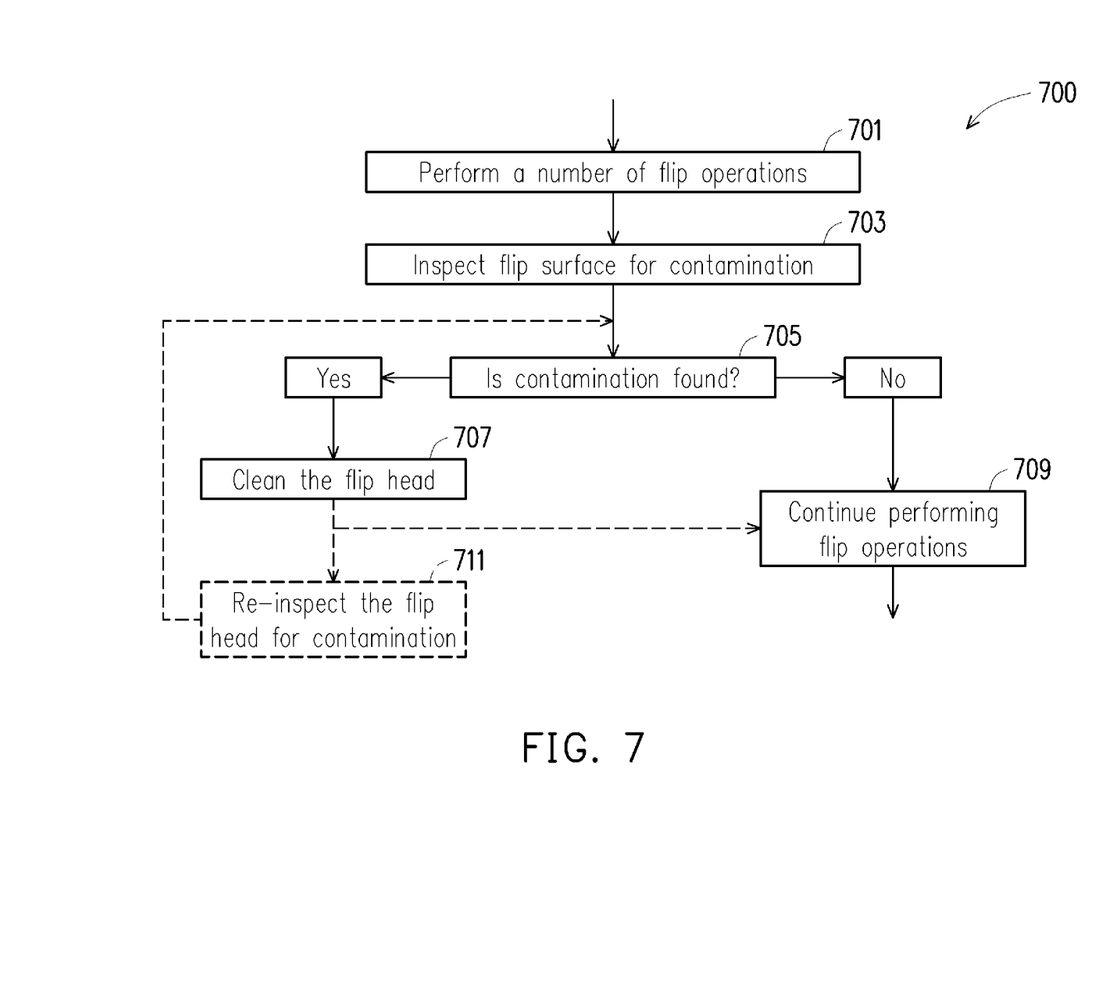
FIG. 7 illustrates a flow chart of an inspection and cleaning method in accordance with some embodiments.

FIG. 7 illustrates a flow chart of a method 700 for inspecting and cleaning a flip surface of a flip head used in a flip module for flipping semiconductor dies. In step 701, the flip module performs a prescribed number of flip operations. In each flip operation, the flip module may flip a semiconductor die and deliver the semiconductor die to a bonding tool. According to various embodiments, the flip module may perform one, five, or ten flip operations in step 701. The flip module may flip each of the semiconductor dies by using a vacuum tool to attach the flip surface to the semiconductor die to be flipped. The flip module may then rotate about an axis in order to flip the semiconductor die.

The bonding tool may also include a vacuum tool. The semiconductor dies may be transferred to the bonding tool by using the vacuum tool of the bonding tool to attach a bonding tool surface of the bonding tool to each semiconductor die. The semiconductor die can then be released from the surface of the flip module by ceasing the vacuum force by the flip module.

After the prescribed number of flip operations has been performed, in step 703, the flip surface is inspected for contaminants. The flip surface may be inspected by an inspection module. The inspection module may comprise an optical microscope, an infrared microscope, or the like. The inspection module inspects the flip surface by capturing a surface image of the flip surface and comparing the captured surface image with a reference surface image of a clean flip surface.

In step 705, the inspection module determines whether the percentage of the flip surface that is contaminated is greater than a threshold value. The threshold value may be about 1%, about 5%, about 10%, or the like. If the inspection module determines that the percentage of the flip surface that is contaminated is greater than the threshold value, the inspection module sends the flip surface to step 707 to be cleaned. On the other hand, if the inspection module determines that the percentage of the flip surface that is contaminated is less than the threshold value, the inspection module sends the flip surface to step 709 to continue performing the flip operations.

In step 707, the flip surface is cleaned. The flip surface may be cleaned by an adhesive cleaning module and/or a liquid cleaning module. The adhesive cleaning module may include an adhesive material such as an adhesive or a tape. The liquid cleaning module may include a liquid cleaning solution such as water. When the flip surface is cleaned by the adhesive cleaning module, the flip surface may be contacted with the adhesive material in order to remove the contaminants from the flip surface. The flip surface may be contacted against the adhesive material one time or multiple times, such as two times, five times, or ten times. When the flip surface is cleaned by the liquid cleaning module, the flip surface may be submerged in the liquid cleaning solution. The flip surface may be submerged in the liquid cleaning solution one time or multiple times, such as two times, five times, or ten times.

When both an adhesive cleaning module and a liquid cleaning module are included, the flip surface may be cleaned first by either the adhesive cleaning module or the liquid cleaning module and then by the other of the adhesive cleaning module or the liquid cleaning module. According to various other embodiments, when both an adhesive cleaning module and a liquid cleaning module are included, the flip surface may be cleaned first by either the adhesive cleaning module or the liquid cleaning module, and then inspected by the inspection module. If the inspection module determines that the percentage of the flip surface that is contaminated is greater than the threshold value, the flip surface may be cleaned by the other of the adhesive cleaning module or the liquid cleaning module.

After the flip surface is cleaned by the adhesive cleaning module and/or the liquid cleaning module, the flip module may continue to perform the flip operations in step 709, or, optionally, the flip surface may be re-inspected in step 711 by the inspection module to determine whether the percentage of the flip surface that is contaminated is less than the threshold value. If the inspection module determines that the percentage of the flip surface that is contaminated is greater than the threshold value, step 705 and all subsequent steps are repeated.

Once the flip surface has been sufficiently cleaned, the flip module proceeds to step 709 and continues to perform the flip operations. This method ensures that any contaminants present on the flip surface are detected and removed such that the contaminants are not transferred to semiconductor dies to be bonded and do not interfere with the alignment of the semiconductor dies. This results in good bonding between the semiconductor dies and semiconductor wafers and prevents bonding yield drop.

In an embodiment, a method includes attaching a first die to a flip head of a flip module, flipping the first die with the flip module, removing the first die from the flip module after the flipping the first die, inspecting the flip head of the flip module for contamination after the removing the first die, cleaning the flip head with an in situ cleaning module after the inspecting the flip head, and attaching a second die to the flip head after the cleaning the flip head. In an embodiment, the flip head is inspected by optical microscopy. In an embodiment, the inspecting the flip head includes capturing a surface image of the flip head, comparing the surface image to a reference image, and determining a contamination percentage based on the comparing the surface image to the reference image. In an embodiment, the method further includes comparing the contamination percentage to a threshold contamination percentage. In an embodiment, the flip head is cleaned when the contamination percentage is greater than the threshold contamination percentage. In an embodiment, the flip head is cleaned by contacting the flip head against an adhesive material. In an embodiment, flip head is cleaned by submerging at least a portion of the flip head in a cleaning solution. In an embodiment, the method further includes re-inspecting the flip head for contamination after the cleaning the flip head and prior to the attaching the second die.

In accordance with another embodiment, a method includes inspecting a flip surface of a flip module in situ for contamination. The inspecting the flip surface includes capturing a surface image of the flip surface, comparing the surface image to a reference image, and determining a percentage of the flip surface that is contaminated. The method further includes cleaning the flip surface of the flip module in situ when the percentage of the flip surface that is contaminated is greater than a non-zero threshold value. In an embodiment, the method further includes attaching a first die to the flip module. In an embodiment, the method further includes attaching the first die to a bond tool surface of a bond tool, the bond tool surface having a surface roughness greater than 0.5 µm. In an embodiment, the method further includes removing the first die from the flip module, positioning the first die over a semiconductor wafer after the removing the first die from the flip module, bonding the first die to the semiconductor wafer, inspecting a position of the first die relative to the semiconductor wafer, and modifying a placement of a second die over the semiconductor wafer based on the position of the first die relative to the semiconductor wafer. In an embodiment, the position of the first die relative to the semiconductor wafer is inspected by infrared optical microscopy (IR-OM). In an embodiment, the threshold value is 5%. In an embodiment, the flip surface is cleaned by an adhesive cleaning module. In an embodiment, the flip surface is cleaned by a liquid cleaning module.

In accordance with yet another embodiment, an apparatus includes a flip module. The flip module includes a flip surface, the flip surface facing in a first direction, the flip surface being rotatable between the first direction and a second direction opposite the first direction. The apparatus further includes an inspection module for inspecting the flip surface of the flip module for contamination in situ and a cleaning module for cleaning the flip surface of the flip module in situ. In an embodiment, the cleaning module includes an adhesive material. In an embodiment, the cleaning module includes a cleaning solution. In an embodiment, the inspection module includes an optical microscope.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus comprising:
    a flip module configured to flip a semiconductor die, the flip module comprising a flip surface having a surface roughness greater than 1 µm;
    an inspection module configured to inspect the flip surface for contamination; and
    a cleaning module configured to clean the flip surface.

2. The apparatus of claim 1, wherein the flip module further comprises a vacuum tool configured to attach the semiconductor die to the flip surface.

3. The apparatus of claim 1, wherein the flip module is further configured to rotate the flip surface between a first position facing a first direction and a second position facing a second direction opposite the first direction.

4. The apparatus of claim 1, wherein the inspection module comprises an optical microscope.

5. The apparatus of claim 1, wherein the cleaning module comprises a liquid cleaning module including a liquid cleaning solution.

6. The apparatus of claim 5, wherein the liquid cleaning solution comprises acetone.

7. The apparatus of claim 1, wherein the cleaning module comprises an adhesive cleaning module.

8. An apparatus comprising:
    a flip module comprising a flip surface, the flip module being rotatable between a first position and a second position, the flip surface facing a first direction in the first position, the flip surface facing a second direction opposite the first direction in the second position;
    a first inspection module for inspecting the flip surface for contamination;
    a cleaning module for cleaning the flip surface; and a second inspection module for inspecting a position of a semiconductor die.

9. The apparatus of claim 8, wherein the flip surface has a surface roughness greater than 1 µm.

10. The apparatus of claim 8, wherein the first inspection module comprises an optical microscope.

11. The apparatus of claim 10, wherein the second inspection module comprises an infrared optical microscope.

12. The apparatus of claim 8, further comprising a bond tool for transferring the semiconductor die from the flip module to semiconductor wafer.

13. The apparatus of claim 12, wherein the flip module comprises a first vacuum tool for attaching the semiconductor die to the flip module, and wherein the bond tool comprises a second vacuum tool for attaching the semiconductor die to the bond tool.

14. A method comprising:
flipping a first die with a flip module;
placing the first die on a semiconductor wafer;
detecting an alignment of the first die on the semiconductor wafer using a first inspection module;
inspecting a flip surface of the flip module for contamination using a second inspection module; and
cleaning the flip surface based on the inspection of the flip surface using a cleaning module.

15. The method of claim 14, further comprising attaching the first die to the flip surface of the flip module using with a first vacuum force.

16. The method of claim 15, further comprising attaching the first die to a bond tool with a second vacuum force, wherein the bond tool places the first die on the semiconductor wafer.

17. The method of claim 14, wherein the flip surface is inspected by optical microscopy.

18. The method of claim 14, wherein inspecting the flip surface comprises:
capturing a surface image of the flip surface;
comparing the surface image to a reference image; and
determining a contamination percentage based on the comparing the surface image to the reference image, wherein the flip surface is cleaned when the contamination percentage is greater than a threshold contamination percentage.

19. The method of claim 14, wherein the cleaning module comprises a liquid cleaning solution, wherein cleaning the flip surface comprises submerging the flip surface in the liquid cleaning solution.

20. The method of claim 14, wherein the cleaning module comprises an adhesive cleaning module, wherein cleaning the flip surface comprises bringing the flip surface into contact with the adhesive cleaning module.

* * * * *